(12) United States Patent
Zhou et al.

(10) Patent No.: US 12,259,777 B2
(45) Date of Patent: Mar. 25, 2025

(54) UNCORRECTABLE MEMORY ERROR PREDICTION

(71) Applicant: Intel Corporation, Santa Clara, CA (US)

(72) Inventors: Shen Zhou, Shanghai (CN); Xiaoming Du, Shanghai (CN); Cong Li, Shanghai (CN); Kuljit S. Bains, Olympia, WA (US); Rajat Agarwal, Portland, OR (US); Murugasamy K. Nachimuthu, Beaverton, OR (US); Maciej Lawniczak, Gdansk (PL); Chao Yan Tang, Shanghai (CN); Mariusz Oriol, Gdynia (PL)

(73) Assignee: Intel Corporation, Santa Clara, CA (US)

( * ) Notice: Subject to any disclaimer, the term of this patent is extended or adjusted under 35 U.S.C. 154(b) by 462 days.

(21) Appl. No.: 17/348,435

(22) Filed: Jun. 15, 2021

(65) Prior Publication Data

US 2023/0083193 A1 Mar. 16, 2023

(51) Int. Cl.
*G06F 11/07* (2006.01)
*G11C 29/44* (2006.01)
*G11C 29/52* (2006.01)

(52) U.S. Cl.
CPC .......... *G06F 11/076* (2013.01); *G06F 11/073* (2013.01); *G06F 11/0751* (2013.01); *G11C 29/44* (2013.01); *G11C 29/52* (2013.01)

(58) Field of Classification Search
CPC .. G06F 11/076; G06F 11/073; G06F 11/0751; G11C 29/44; G11C 29/52; G11C 2029/0409
See application file for complete search history.

(56) References Cited

U.S. PATENT DOCUMENTS

| 7,409,594 | B2 | 8/2008 | Mukherjee et al. |
| 10,558,521 | B2* | 2/2020 | Sankaranarayanan ....................... G06F 11/1048 |
| 10,705,901 | B2 | 7/2020 | Shah et al. |
| 2007/0088974 | A1 | 4/2007 | Chandwani et al. |
| 2009/0271676 | A1 | 10/2009 | Biswas et al. |
| 2016/0148707 | A1 | 5/2016 | Yazdanbakhsh et al. |
| 2019/0129777 | A1 | 5/2019 | Rangarajan |
| 2019/0266036 | A1 | 8/2019 | Franco et al. |
| 2019/0266037 | A1 | 8/2019 | Shah et al. |
| 2020/0210267 | A1* | 7/2020 | Rooney .............. G06F 11/0766 |
| 2021/0064462 | A1* | 3/2021 | Eun .................. G11C 29/4401 |
| 2021/0182152 | A1* | 6/2021 | Shin ....................... G11C 16/08 |

(Continued)

OTHER PUBLICATIONS

Q. Yu, W. Zhang, J. Cardoso and O. Kao, "Exploring Error Bits for Memory Failure Prediction: An In-Depth Correlative Study," 2023 IEEE/ACM International Conference on Computer Aided Design (ICCAD), San Francisco, CA, USA, 2023, pp. 01-09, (Year: 2023).*

*Primary Examiner* — Cynthia Britt
(74) *Attorney, Agent, or Firm* — Compass IP Law PC

(57) ABSTRACT

A system can predict memory device failure through identification of correctable error patterns based on the memory architecture. The failure prediction can thus account for the circuit-level of the memory rather than the mere number or frequency of correctable errors. A failure prediction engine correlates hardware configuration of the memory device with correctable errors (CEs) detected in data of the memory device to predict an uncorrectable error (UE) based on the correlation.

25 Claims, 11 Drawing Sheets

(56) References Cited

U.S. PATENT DOCUMENTS

| | | | | |
|---|---|---|---|---|
| 2021/0342241 A1* | 11/2021 | Gurumurthi | ........ | G06F 11/3037 |
| 2022/0050603 A1* | 2/2022 | Zhou | ..................... | G06F 3/0679 |
| 2022/0129347 A1* | 4/2022 | Fuller | ..................... | G11C 29/44 |
| 2022/0350715 A1* | 11/2022 | Zhou | ..................... | G11C 29/52 |
| 2023/0086101 A1* | 3/2023 | Li | ..................... | G06F 11/073 |
| | | | | 714/6.21 |
| 2023/0161655 A1* | 5/2023 | Schlichting | ........... | G06F 11/008 |
| | | | | 706/21 |
| 2024/0241778 A1* | 7/2024 | Zhou | ..................... | G06F 11/079 |

\* cited by examiner

UNCORRECTABLE MEMORY ERROR PREDICTION

PRIORITY

This application claims the benefit of priority of Application No. PCT/CN2021/085795, filed Apr. 7, 2021.

FIELD

Descriptions are generally related to memory systems, and more particular descriptions are related to prediction of uncorrectable errors.

BACKGROUND

Increasing memory device density and operating speeds, coupled with smaller feature size for memory device manufacturing processes, have tended to cause increases in runtime errors for memory devices. Memory errors can be classified as correctable error (CE) or uncorrectable error (UE). CEs refer to transient errors within the memory device data that can be corrected with the application of error checking and correction (ECC). UEs refer to errors that cannot reasonably be corrected with the application of ECC, and result in catastrophic system failure.

There are systems that attempt to predict fatal (uncorrectable) errors to reduce unplanned system downtime. Traditional fault prediction is threshold-based counting of correctable errors (CEs). Traditional correctable error statistics, even if coupled with historical information about CEs, do not provide reliable UE prediction in memory systems.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
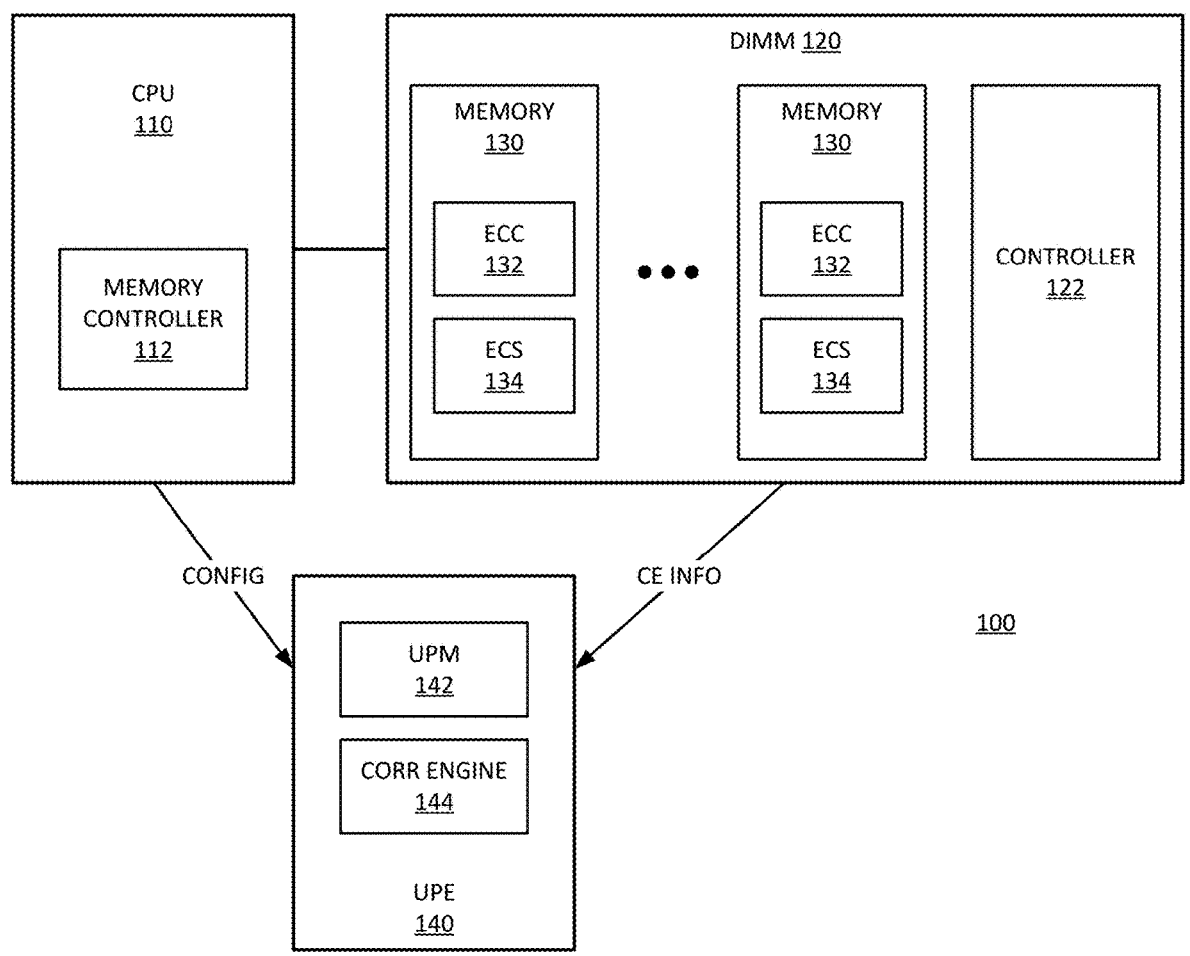
FIG. 1 is a block diagram of an example of a system with uncorrectable error prediction.

Descriptions of certain details and implementations follow, including non-limiting descriptions of the figures, which may depict some or all examples, and well as other potential implementations.

DETAILED DESCRIPTION

As described herein, memory device fault prediction is provided based on correctable error information correlated with system architecture information. Thus, the system can account for rank, bank, row, column, or other information related to the physical organization and structure of the memory in predicting uncorrectable errors. It can be observed that uncorrectable errors tend to cause faults at the column, row, or bit level, which is not informed by a total correctable error (CE) count. Seeing that faults are often related to circuit structure rather than total CE count, predicting failure based on circuit-level information provides more reliable prediction.

The system can predict memory device failure through identification of correctable error patterns based on the memory architecture. The failure prediction can thus account for the circuit-level of the memory rather than the mere number or frequency of correctable errors. Thus, the system can predict uncorrectable memory errors or uncorrectable errors (UEs) by evaluating microlevel CE information. The microlevel information can be error information at the level of bit or DQ (data interface to the data bus), row, column, device, rank, or other information.

A failure prediction engine correlates correctable errors (CEs) detected in the memory device to a hardware configuration of the memory device. The correlation can be considered a correlation of faults corresponding to different hardware configuration of the memory device with the CEs. Thus, in one example, a failure prediction engine correlates faults corresponding to hardware configuration of the memory device with CEs detected in data of the memory device to predict an uncorrectable error UE based on the correlation. In one example, the system builds error prediction models based on machine learning from historical CE information. Based on historical error information, the system can apply microlevel CE information to infer the latent faulty status of the memory hardware, such as predicting row fault, column fault, bank fault, or other fault. In one example, the system can correlate latent fault indicators based on runtime correctable error information with historical uncorrectable error observations through a model learned empirically. The system can store pre-learned prediction models embedded in a microcontroller or firmware logic to perform real time UE prediction. Thus, in one example, the system can output prediction results as platform telemetry per DIMM (dual inline memory module).

Improved prediction can improve system RAS (reliability, availability, and serviceability) by detecting the likelihood of failure and taking remedial action instead of waiting for a failure to occur. The system can then perform predicative memory failure alerting and risk mitigation. For example, instead of having a memory fault occur that could take down a computer system or server, the system can predict the UE, raise an alert, and perform data migration to allow servicing of the computer system or server.

FIG. 1 is a block diagram of an example of a system with uncorrectable error prediction. System 100 illustrates memory coupled to a host. CPU (central processing unit) 110 represents a host computing platform, such as an SOC (system on a chip). CPU 110 includes host processing elements (e.g., processor cores) and memory controller 112. CPU 110 includes hardware interconnects and driver/receiver hardware to provide the interconnection between CPU 110 and DIMM (dual inline memory module) 120.

DIMM 120 includes memory 130, which represents parallel memory resources coupled to CPU 110. Memory controller 112 controls access to memory 130. DIMM 120 includes controller 122, which represent control logic of DIMM 120. In one example, controller 122 is, or is part of, control logic that manages the transfer of commands and data on DIMM 120. For example, controller 122 can be part of a registering clock driver (RCD) or other control logic on DIMM 120.

In one example, memory 130 includes ECC (error checking and correction) 132, which represents on-die ECC, or logic on the memory device to perform error correction for data exchange with CPU 110. In one example, memory 130 includes ECS (error checking and scrubbing) 134. ECS 134 represents logic on-die on memory 130 to perform period error scrubbing of data stored on the memory and can be referred to as a scrubbing engine. Error scrubbing refers to detecting errors, correcting the errors, and writing the corrected data back to the memory array.

Alternatively to on-die ECC and ECS, in one example, controller 122 could include logic to perform ECC local to DIMM 120. It will be understood that memory controller 112 performs system-level ECC on data from multiple memory devices 130 in parallel, while ECC 132 performs ECC for a single device based on local data. On-die ECC 132 or ECC logic on controller 122 can enable error correction prior to sending data to CPU 110. In one example, ECS 134 uses ECC 132 to perform error scrubbing.

ECS 134 can perform patrol scrubbing, which refers to performance of error checking and scrubbing of all memory 130 within a set period, such as scrubbing the entire memory every 24 hours. ECS 134 can generate CE and UE information during the scrub to indicate correctable errors and hard faults or uncorrectable errors detected in memory 130. When ECS 134 detects errors in data of memory 130, in one example, ECS 134 stores the information and sends the information to memory controller 112, which can further record the data to use for prediction.

System 100 includes UPE (uncorrectable error prediction engine) 140. In one example, UPE 140 is part of controller hardware of a hardware platform of system 100. For example, UPE 140 can be part of the system board chipset, such as the control circuitry of a system board or motherboard. UPE 140 can be referred to as a memory failure prediction engine.

When part of the system board, system 100 can be referred to as a having an autonomous analytics engine deployed locally to the computer system. Deploying failure prediction analytics locally to the computer system allows UPE 140 to process the data stream directly on the computer device. Local prediction analytics can minimize the number of datapoints streamed over a network. In one example, UPE 140 is part of controller 122. In one example, UPE 140 is part of memory controller 112.

In one example, UPE 140 represents a UE prediction engine implemented in a microcontroller on a system board. In one example, the microcontroller is a dedicated controller for error management. In one example, the microcontroller is part of system board control hardware, and UPE 140 can be implemented as firmware on the microcontroller. Thus, a microcontroller that executes UPE 140 can also perform other operations. Implementing UPE 140 on the system board can reduce the overall impact of the system management mode (SMM) on the platform by offloading a RAS flow processing from BIOS (basic input/output system). In one example, UPE 140 implemented in firmware can allow the persistence of the memory scoring through platform resets and power-downs, to maintain and update the memory health score through the platform lifecycle.

In one example, UPE 140 includes UPM (uncorrectable error prediction model) 142 and correlation (CORR) engine 144. UPM 142 can represent a model of expected error conditions based on patterns of correctable errors detected in memory data. UPM 142 can be referred to as a failure prediction model for the memory. The patterns of correctable errors refer specifically to patterns of errors based on patterns of errors with respect to hardware or memory architecture. Correlation engine 144 can correlate detected errors in the data with hardware configuration information to identify patterns that are indicative of a high likelihood of imminent uncorrectable error.

In one example, CPU 110 provides configuration information (CONFIG) to UPE 140 to indicate hardware information. In addition to memory hardware information, in one example, the configuration information can include information about the processor, operating system, peripheral features and peripheral controls, or other system configuration information. In one example, memory 130 provide correctable error information (CE INFO) to UPE 140 to indicate when and where CEs have occurred. In one example, correlation engine 144 correlates the CE information, including information about when and where errors have occurred within the memory structure, with configuration information, such as memory configuration and system platform configuration.

When UPE 140 is implemented locally to memory 130 or locally to the computer system of system 100, a system controller can collect information to compare against stored prediction model information. As such, there is no need to raise interrupts to software to request information from the operating system (OS). In one example, the prediction model represents CE historical information. Thus, system 100 can apply CE history in predicting failures. In one example, the historical information can be of a similar granularity as the information gathered by UPE 140, identifying hardware-level information that can be correlated with detected CEs.

In one example, UPE 140 correlates detected errors with hardware configuration information for DIMM 120 and memory 130. Such information can be referred to as the memory hardware configuration. In one example, UPE 140 correlated detected errors with hardware configuration information for the computer system, which can include memory hardware configuration as well as hardware, software, and firmware configuration of one or more components of the system board or the host hardware platform. The host hardware platform can refer to the configuration of the host processor and other hardware components that enable operation of the computer system. The software or firmware configuration of a system can be included with hardware configuration information to the extent that the software configuration of the hardware causes the same hardware to operate in different ways.

UPE 140 can apply correlation engine 144 to correlate CE information with configuration information. In one example, correlation engine 144 accounts for historical CE and hardware configuration information based on models stored in UPM 142. In one example, CE information is generated by ECS 134 and provided to UPE 140 for prediction of uncorrectable errors.

Figure 2A:
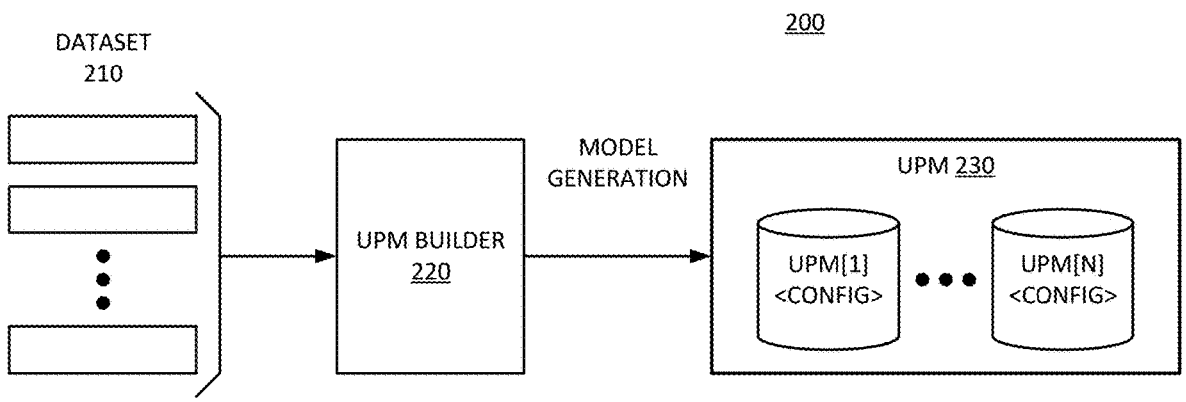
FIG. 2A is a block diagram of an example of uncorrectable error prediction training.

FIG. 2A is a block diagram of an example of uncorrectable error prediction training. System 200 represents elements of a training phase or a training system for prediction of memory fault due to uncorrectable error. System 200 can provide information for an example of UPM 142 of system 100. In one example, system 200 can be considered an offline prediction model training, in that dataset 210 represents data for past system operations. An online system refers to a system that is currently operational. System 200 is "operational" in the sense that it is operational to generate the model, but generates the model based on historical data rather than realtime or runtime data.

In one example, system 200 includes dataset 210. Dataset 210 can represent a large-scale CE and UE failure dataset that includes microlevel memory error information. The microlevel memory error information can include indications of failure based on bit, DQ, row, column, device, rank, channel, DIMM, or other configuration, or a combination of information. In one example, dataset 210 includes timestamp to indicate when errors occurred. In one example, dataset 210 includes hardware configuration information associated with the error dataset. The hardware configuration information can include information such as memory device information, DIMM manufacturer part number, CPU model number, system board details, or other information, or a combination of such information. In one example, dataset 210 can represent information collected from large-scale datacenter implementations.

System 200 includes UPM (UE prediction model) builder 220 to process data from dataset 210 to generate a model that indicates configurations with error patterns that are likely to result in a UE. In one example, UPM builder 220 represents software logic for AI (artificial intelligence) training to generate the model. In this context, AI represents neural network training or other form of data mining to identify patterns of relationship from large data sets. In one example, UPM builder 220 generates UPM 230 for each hardware configuration, based on microlevel (e.g., bit, DQ, row, column, device, rank) CE patterns or indicators. Thus, UPM 230 can include N different UPMs (UPM[1:N]) based on different configuration information (CONFIG).

In one example, UPM 230 includes a separate prediction model for each combination of a CPU model and a DIMM manufacturer or part number. Such granularity for different combinations of CPU model and DIMM part number can identify fault hardware patterns differently, seeing that the different hardware configurations can cause different hardware fault statuses. For example, DIMMs from the same manufacturer or with the same part number but with a different CPU model may implement ECC differently in the memory controller, causing the same faulty hardware status of a DIMM to exhibit different observations due to a different behavior of ECC implementation. A CPU family may provide multiple ECC patterns, allowing a customer to choose the ECC based on the application the customer selects. Similarly, for the same CPU model with a DIMM from a different manufacturer or with a different part number, the faulty status of a DIMM my exhibit different observations due to the different design and implementation of the DIMM hardware. Thus, in one example, system 200 creates prediction models per combination of CPU model and DIMM manufacture or part number to provide improved prediction accuracy performance.

Figure 2B:
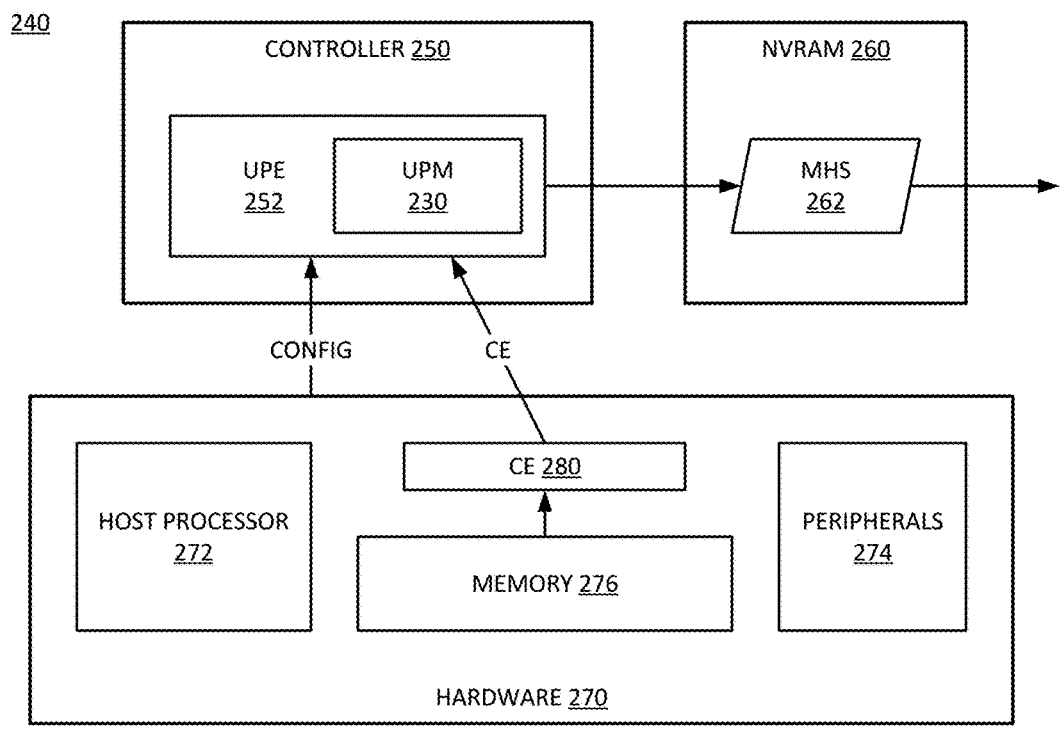
FIG. 2B is a block diagram of an example of uncorrectable error prediction based on the training of FIG. 2A.

FIG. 2B is a block diagram of an example of uncorrectable error prediction based on the training of FIG. 2A. System 240 represents an example of a system with a UPE in accordance with an example of system 100. System 240 implements an example of UPM 230 of system 200. Whereas system 200 can operate based on historical or stored information, system 240 can be considered a runtime memory failure prediction system in that system 240 operates on runtime or realtime parameters as they occur.

In one example, system 200 of FIG. 2A provides machine-learning based uncorrectable memory error prediction mechanism at the level of the memory device (e.g., at the DIMM level). In one example, system 240 utilizes system 200 to generate a runtime prediction of failure and expose the result through telemetry of the platform. For example, system 240 can generate memory health score (MHS 262) as information to pass to a system management component. The system management component refers to a component that manages memory health and can cause predictive action in anticipation of a memory failure.

System 240 includes controller 250, which can be a dedicated controller, or can represent firmware to execute on a shared controller or hardware shared with other control or management functions in the computer system. Controller 250 executes UPE 252, which represents a UE prediction engine in accordance with any example described. UPE 252 can store or access UPM 230, which represents a model generated by UPM builder 220 of system 200.

In one example, UPM 230 represents a hardware version of a prediction model. A prediction model implemented in hardware can be a model that is fixed at boot time. In one example, UPM 230 represents a firmware version of a prediction model. In one example, UPE 252 fetches UPM 230 at runtime. In one example, the firmware model can be updatable at runtime of the system. Thus, UPM 230 can be a representation of a model based on historical error data, which can include correctable error information and the occurrence of uncorrectable errors. The UPM can then be updated at runtime based on additional error information. In one example, UPM 230 represents a version of a prediction model that is implemented in a combination of hardware and firmware.

Controller 250 can execute a memory failure prediction algorithm through execution of UPE 252. In one example, UPE 252 receives configuration information (CONFIG) from hardware 270 as correctable error information (CE) from memory 276. In one example, UPE 252 can correlate the hardware configuration with the CE information based on the generated UPM 230. UPE 252 can provide runtime uncorrectable memory error prediction.

Hardware 270 represents the hardware of the system to be monitored for memory errors. Hardware 270 provides hardware configuration to UPE 252 for prediction analysis. Hardware 270 can include host processor 272, which represents processing resources for a computer system, memory 276 and peripherals 274. Memory 276 represents the memory resources for which correctable errors can be identified. CE 280 represents the CE data for errors detected in data of memory 276.

Peripherals 274 represent components and features of hardware 270 that can change the handling of memory errors. Thus, hardware components and software/firmware configuration of the hardware components that can affect how memory errors are handled can be included for consideration in configuration information to send to UPE 252 for memory fault prediction. Examples of peripheral configuration can include peripheral control hub (PCH) configuration, management engine (ME) configuration, quick path interconnect (QPI) capability, or other components or capabilities.

In one example, UPE 252 tracks and decodes the runtime CE data that indicates errors detected in memory 276 to obtain the micro-level information and feeds the decoded memory error data and corresponding CPU and memory configuration periodically to UE prediction engine (UPE) which is built into the microcontroller or firmware along with pre-generated UPM.

In one example, based on the hardware configuration and correctable error information, UPE 252 generates a runtime uncorrectable memory error prediction for system 240. In one example, UPE 252 provides and stores a prediction indicator in NVRAM (nonvolatile random access memory) 260. In one example, UPE 252 outputs a prediction confidence score as the indicator of how likely a UE will happen on a DIMM. MHS (memory health score) 262 represents prediction information for memory 276. While NVRAM 260 is illustrated, the memory health or fault indicators can be stored in registers or other memory locations, whether nonvolatile or volatile, depending on the system configuration.

In one example, UPE 252 reports out MHS 262 after generating the prediction. In one example, UPE 252 stores MHS 262 and awaits a querying or polling by a system management device. MHS 262 can be referred to as UE prediction score telemetry data. In one example, MHS 262 includes UE prediction score telemetry on a per-DIMM basis. In one example, NVRAM 260 represents a secure storage infrastructure to store the UE prediction score value. In one example, UPE 252 periodically stores the UE prediction indication in NVRAM 260, enabling system 240 to retain score values between system power cycles.

In one example, UPE 252 operates in accordance with the following sequence. System 240 identifies CE information provided to UPE 252. In one example, all error information is passed to UPE 252, and CE information is used for correlation to perform runtime failure prediction. In one example, UPE 252 determines if a detected error is a CE or UE. If the detected error is a CE, UPE 252 can apply a correlation model with UPM 230, hardware configuration information, and the CE information. UPE 252 can update a health score based on the results of the correlation. In one example, a health score threshold could indicate that a memory resource should be offlined (e.g., a health score of zero or close to zero). In one example, UPE 252 maintains health score information until the health score has reached a threshold. In response to reaching a health score threshold, UPE 252 can provide MHS 262 to a device manager, which will determine how to respond.

In one example, UPE 252 identifies a failure threshold from UPM 230. After correlation of CE and hardware information, UPE 252 can determine if the health score has reached the failure threshold. In one example, in response to reaching the threshold, UPE 252 can signal the predicted failure to the host. In one example, the threshold will be different for different hardware configurations. Thus, UPE 252 can identify a failure prediction threshold based on UPM 230 to determine when to indicate a high probability of memory failure due to uncorrectable error.

Figure 3A:
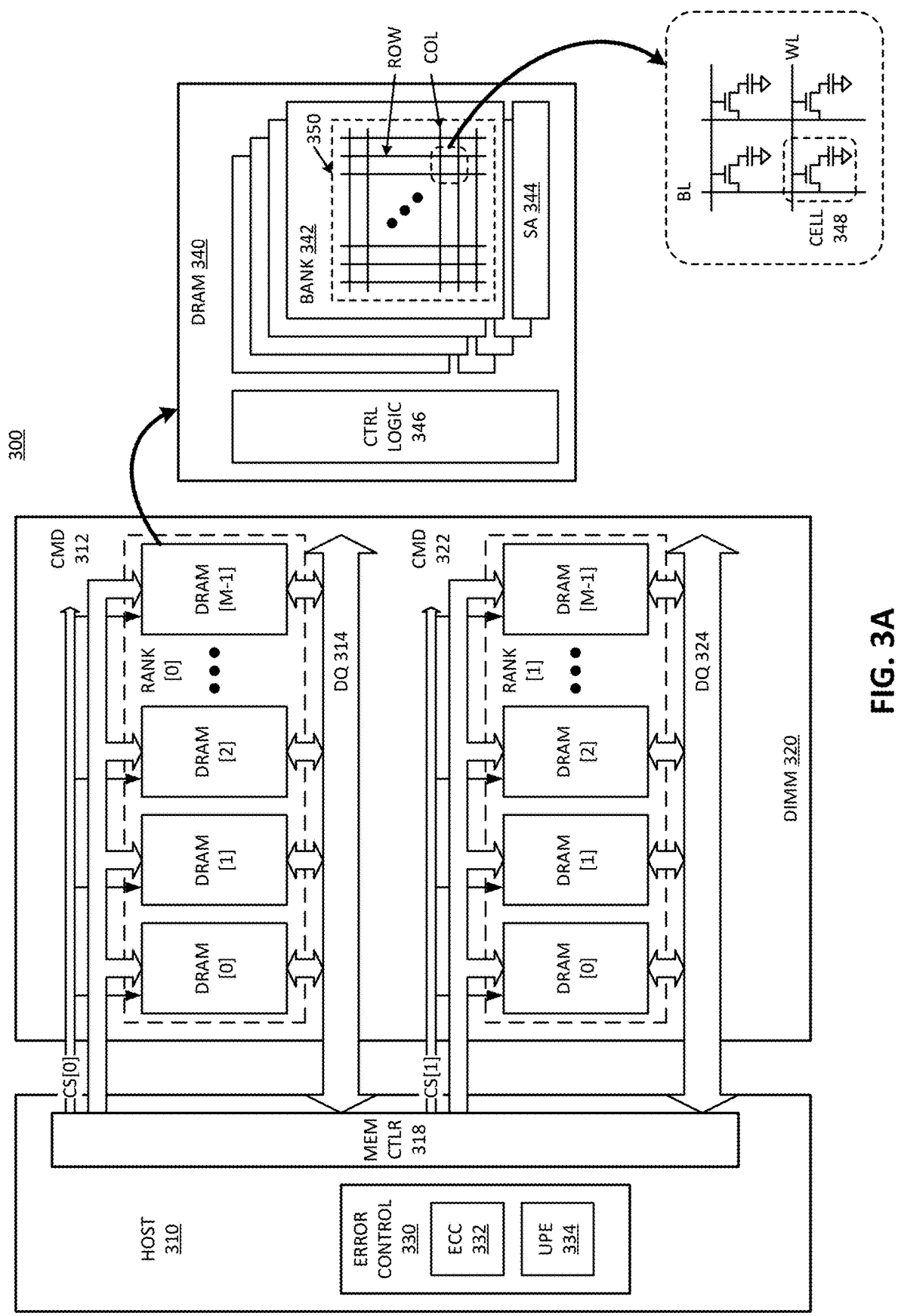
FIG. 3A is a block diagram of an example of a system architecture for uncorrectable error prediction.

FIG. 3A is a block diagram of an example of a system architecture for uncorrectable error prediction. System 300 illustrates a computer system in accordance with an example of system 100. System 300 includes host 310 connected to DIMM 320. Host 310 represents the host hardware platform for the system in which DIMM 320 operates. Host 310 includes a host processor (not explicitly shown) to execute operations that request access to memory of DIMM 320.

DIMM 320 includes multiple memory devices identified as DRAM (dynamic random access memory) devices or DRAMs connected in parallel to process access commands. DIMM 320 is more specifically illustrated as a two-rank DIMM, with M DRAMs (DRAM [0:M-1]) in each rank, Rank 0 and Rank 1. M can be any integer. Typically, a rank of DRAMs includes data DRAMs to store user data and ECC DRAMs to store system ECC bits and metadata. System 300 does not distinguish DRAM purpose. In one example, the DRAM devices of system 300 represents DRAM devices compatible with a double data rate version 5 (DDR5) standard from JEDEC (Joint Electron Device Engineering Council, now the JEDEC Solid State Technology Association).

The DRAMs of a rank share a command bus and chip select signal lines, and have individual data bus interfaces. CMD (command) 312 represents a command bus for Rank 0 and CMD (command) 322 represents the command bus for Rank 1. The command bus could alternatively be referred to as a command and address but. CS0 represents a chip select for the devices of Rank 0 and CS1 represents the chip select for the devices of Rank 1. DQ 314 represents the data (DQ) bus for the devices of Rank 0, where each DRAM contributes B bits, where B is an integer, for a total of B*M bits on the DQ bus. DQ 324 represents the data (DQ) bus for the devices of Rank 1.

DRAM 340 provides a representation of an example of details for each DRAM device of system 300. DRAM 340 includes control (CTRL) logic 346, which represents logic to receive and decode commands. Control logic 346 provides internal control signals to respond to commands received on the command bus. DRAM 340 includes multiple banks 342, where the banks represent an organization of the memory array of DRAM 340. Banks 342 have individual access hardware to allow access in parallel or non-blocking access to different banks. Subarray 350 of bank 342 is described below with respect to FIG. 3B. The portion labeled as 350 is a subarray of the total memory array of DRAM 340.

The memory array includes rows (ROW) and columns (COL) of memory elements. SA (sense amplifier) 344 represents a sense amplifier to stage data for a read from the memory array or for a write to the memory array. Data can be selected into the sense amplifiers to allow detection of the value stored in a bit cell or memory cell of the array. The dashed box that includes the intersection of the labeled row and column of the memory array. The dashed portion illustrated a typical DRAM cell 348, including a transistor as a control element and a capacitor as a storage element.

Memory controller (MEM CTLR) 318 represents a memory controller that controls access to the memory resources of DIMM 320. Memory controller 318 provides access commands to the memory devices, including sending data for a write command or receiving data for a read command. Memory controller 318 sends command and address information to the DRAM devices and exchanges data bits with the DRAM devices (either to or from, depending on the command type).

In one example, host 310 includes error control 330. Error control 330 represents logic in system 300 to perform error management for the DRAM devices. In one example, error control includes ECC 332, which represents system-level ECC for error correction of data to store in the various DRAM devices. System-level ECC can perform error correction based on data stored across the DRAMs of a rank.

In one example, error control 330 includes UPE 334, which represents an uncorrectable error prediction engine, such as UPE 252 of system 240. UPE 334 receives information indicating correctable errors for the DRAMs and correlates the CE information with device architecture information. UPE 334 can generate a prediction that indicates a likelihood that an uncorrectable error will occur in a given memory device or rank.

Figure 3B:
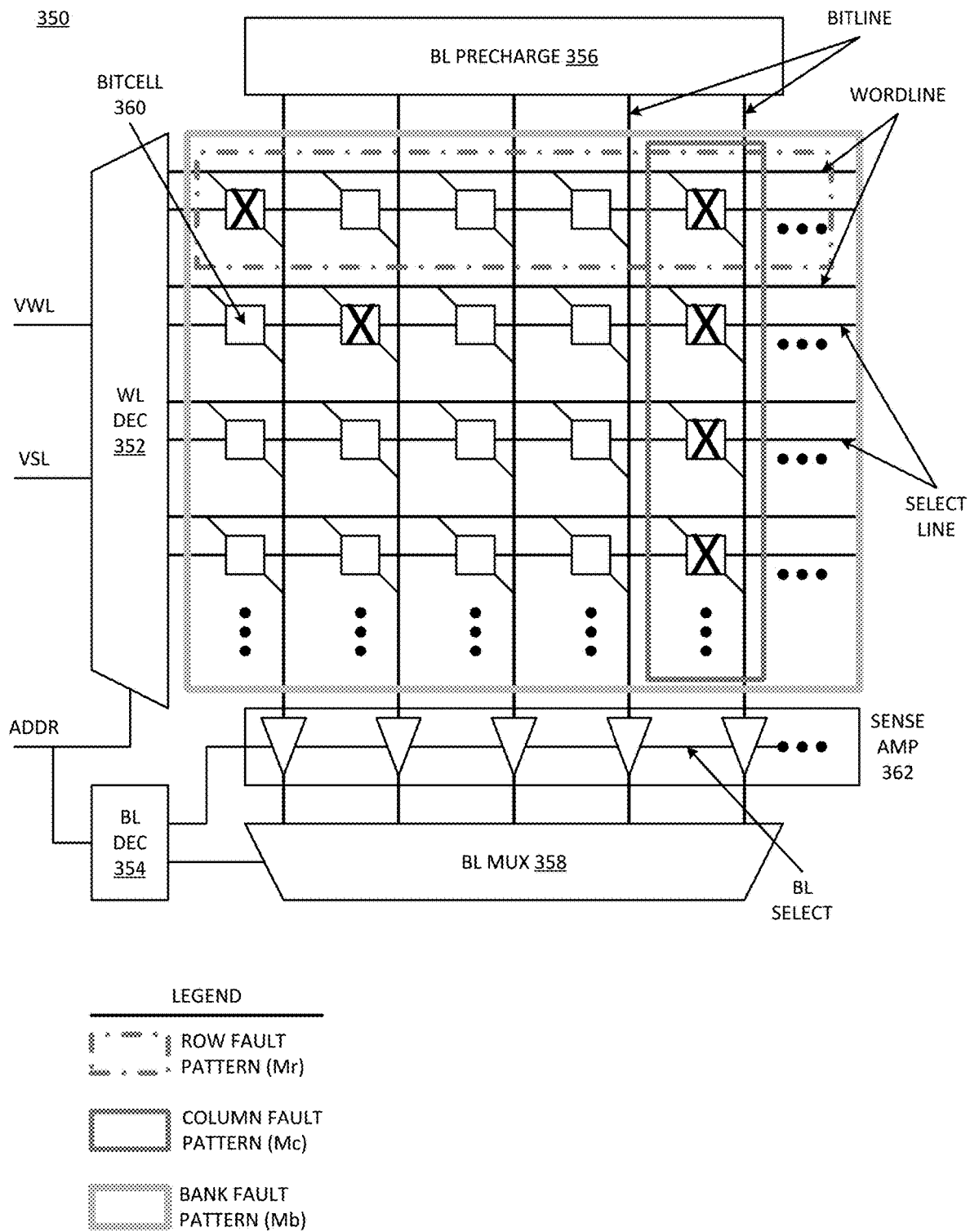
FIG. 3B is a block diagram of an example of uncorrectable error prediction based on memory architecture.

FIG. 3B is a block diagram of an example of uncorrectable error prediction based on memory architecture. Subarray 350 illustrates a portion of the memory array of DRAM 340 that makes up bank 342. Subarray 350 illustrates access hardware and multiple memory cells of the memory array.

Bitcell 360 represents a memory cell or a storage location of the memory array. Bitcell 360 connects to a wordline and a bitline, with the specific WL/BL location representing an address identifiable by a combination of row (WL) and column (BL) address. The select line can enable selection of the wordline.

WL (wordline) decoder (DEC) 352 represents decoding hardware to select rows for read, write, or other access. WL DEC 352 can receive a voltage for a wordline (Vwl) and a voltage for a select line (Vsl) and provide appropriate voltages for selection of a row based on address (ADDR) information received for an operation. The wordline voltage, Vwl, can be a read voltage level to read a wordline. The select line voltage, Vsl, can be VDD or a high rail for a digital signal swing.

BL (bitline) precharge 356 represents hardware that can charge one or more selected bitlines for an access operation for subarray 350. BL precharge 356 can charge the bitlines for reading to enable sensing the value stored in a bitcell identified by column and row address. Sense amp 362 represents the sense amplifier circuits to sense the digital value stored in a bitcell. Bitline (BL) multiplexer (MUX) 358 represents optional hardware to select the output. BL mux 358 may not be necessary for selection with bitline (BL) decoder (DEC) 354 to control the selection of the output bits through sense amp 362. BL DEC 354 represents selection hardware to select the desired outputs, whether through BL mux 358, or directly from sense amp 362.

Subarray 350 has shaded boxes surrounding one of the rows, one of the columns, and around the entire bank. The legend indicates that the dashed gray line is around a row, the darker gray line is around a column, and the lighter gray line is around the bank. In one example, the UPE engine, such as UPE 334, can generate multiple microlevel fault indicators to track a potential memory or DIMM failure due to one or more latent faults based on a pattern of the microlevel correctable error historical information. Examples of the possible indicators follow. It will be understood that other indicators can be used in addition to these indicators, or in place of one or more of these indicators.

The dashed gray line can be associated with a row. In one example, the row will have a row fault indicator, $M\_r$. In one example, $M\_r=(X\_r, R\_r|T\_r)$, where $X\_r$ represents a number of unique grids or a unique location in subarray 350, $R\_r$ represents a region length which indicates how many bitcells are covered, and $T\_r$ represents a time window, such as 24 hours. Thus, $M\_r$ can have an indication of the number of correctable errors observed on at least $X\_r$ unique grids in the row spanning a region of length $R\_r$ over a prior time window of $T\_r$. In one example, the indicator $M\_r$ is an indicator to be set or cleared based on whether the precondition tests true. Thus, if the condition is satisfied, the UPE can set or activate $M\_r$ as an indication of a potential row fault for the specific row. The rows can be tested individually. The specific parameter values of $X\_r$, $R\_r$, and $T\_r$ can either be predefined from several candidates or determined in learning.

The darker gray line can be associated with a column. In one example, the column will have a column fault indicator, $M\_c$. In one example, $M\_c=(X\_c, R\_c|T\_c)$. The UPE can check for correctable errors observed on at least $X\_c$ unique grids (e.g., 8 cells of 4-bit nibbles) in a column (e.g., 32 bitlines in a bank) spanning a region with length at least $R\_c$ in a past time window of $T\_c$. In one example, the indicator $M\_r$ is an indicator to be set or cleared based on whether the precondition tests true. Thus, if the condition is satisfied, the UPE can set or activate $M\_c$ as an indication of a potential column fault for the specific column. The columns can be tested individually. The specific parameter values of $X\_c$, $R\_c$, and $T\_c$ can either be predefined from several candidates or determined in learning.

The lighter gray line can be associated with a bank. In one example, the bank will have a bank fault indicator, $M\_b$. In one example, $M\_b=(X\_b, R\_c, R\_r|T\_b)$. The UPE can check for correctable errors observed on at least $X\_b$ unique grids in a bank spanning a region with the area at least $R\_r \times R\_c$ over a prior time window of $T\_r$. In one example, the indicator $M\_b$ is an indicator to be set or cleared based on whether the precondition tests true. Thus, if the condition is satisfied, the UPE can set or activate $M\_b$ as an indication of a potential bank fault. The specific parameter values of $X\_b$, $R\_c$, $R\_r$, and $T\_b$ can either be predefined from several candidates or determined in learning.

In one example, the UPE has microlevel fault indicators including column fault indicators, row fault indicators, bank fault indicators, weak cell indicators, and error storm indicators. Other indicators can also be used. The indicators illustrated provide CE statistics that include error count and error rate, while also including error location and time between error appearances. Such factors or parameters in the error indicators can provide increased accuracy of the memory fault prediction. The indicators used can vary by system configuration. In one example, the UPE will weight certain factors higher than others. For example, a system employing multiple indicators can have certain indicators that have a stronger correlation to failure, and can be weighted accordingly.

Whether with the indicators shown, or other indicators, the UPE engine can perform computations to generate a failure prediction, such as an uncorrectable error prediction. The indicators illustrated provide example of correlation of hardware structure to correctable error detection to generate a prediction. It can be observed that the indicators illustrated are structure-specific fault indicators for the memory device. In one example, the row fault predictor indicates a pattern of CEs detected in a row of memory. In one example, the column fault predictor indicates a pattern of CEs detected in a column of memory. In one example, the bank fault predictor indicates a pattern of CEs detected in a bank of memory. The various indicators can include one or more parameters based on a rate of errors for the specific hardware structure.

In one example, for each DIMM, given the microlevel correctable error information history tracked, the system can know at any time whether the indicators have been activated or not. At time t, the system can have an attribute list (M_1^(t), M_2^(t), . . . , M_n^(t)) to denote the current activation status of each indicator. In one example, the UE prediction model maps the status of the indicators to a prediction output, with f (M_1^(t), M_2^(t), . . . , M_n^(t)). The prediction output can indicate whether or how likely a UE will happen in the near future. In one example, the function f is learned from large-scale data analyzed to generate the model. Testing correlation-based prediction of failure modes on multiple different memory system configurations can indicated a strong correlation to memory error types and prediction of errors. A system in accordance with system 300 detected a majority of multibit errors as CE as opposed to DUE (detectable, uncorrectable error), given the dependence of errors on the data pattern. The system testing illustrated that the majority of errors will be a subset of larger errors, with a high probability of hitting a CE pattern before a DUE pattern. In such a case, the system can map out the bad page in memory, resulting in fewer crashes resulting from DUE or SDE (silent data error) conditions.

Figure 4:
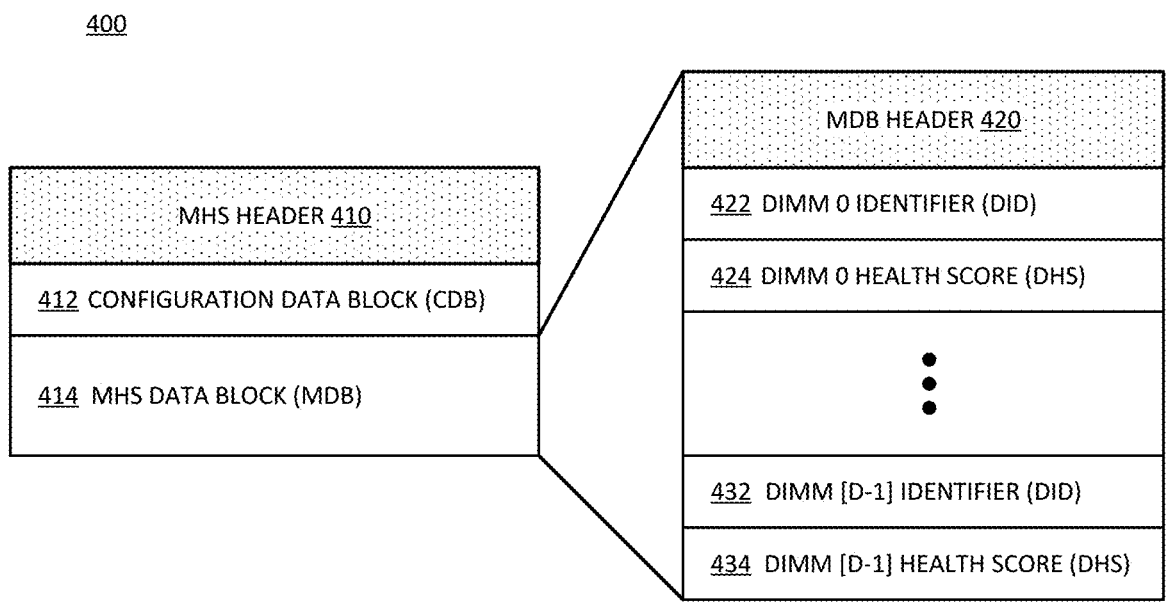
FIG. 4 is a table illustrating an example of a layout of health score information.

FIG. 4 is a table illustrating an example of a layout of health score information. Table 400 provides an example storage layout for memory health score telemetry to be stored based on the correlation of detected errors with hardware indicators.

In one example, the format of table 400 includes a memory health score (MHS) header 410. The body or payload of the MHS data can include configuration data block (CDB) 412 and MHS data block (MDB) 414. CDB 412 provides information about a hardware configuration associated with the score. In one example, MDB 414 includes data for all memory resources associated with the hardware configuration. For example, a server system can include multiple different hardware configurations, with each hardware configuration having multiple different memory resources to which the configuration applies.

In one example, MDB 414 includes MDB header 420. MDB 414 can include DIMM 0 identifier (DID) 422 with an associated DIMM 0 health score (DHS) 424. MDB 414 can include information for D different DIMMs, DIMM [0:D-1]. DID 432 shows the DIMM [D-1] identifier and DHS 434 illustrates the DIMM [D-1] health score.

In one example, the MHS is stored in firmware associated with a controller that executes the UPE. In one example, the MHS is stored in a system board storage location accessible by any management software. In one example, the MHS is stored in BIOS or in a BMC (baseboard management controller, or other out of band management that operates independently of the host operating system). In one example, the MHS data is stored persistently in a computing system when the UPE computes the data. Persistently stored MHS data can enable the UPE to load the MHS information during boot. In one example, the UPE polls errors from registers written by an ECS or other registers that store error reports in the memory.

Figure 5:
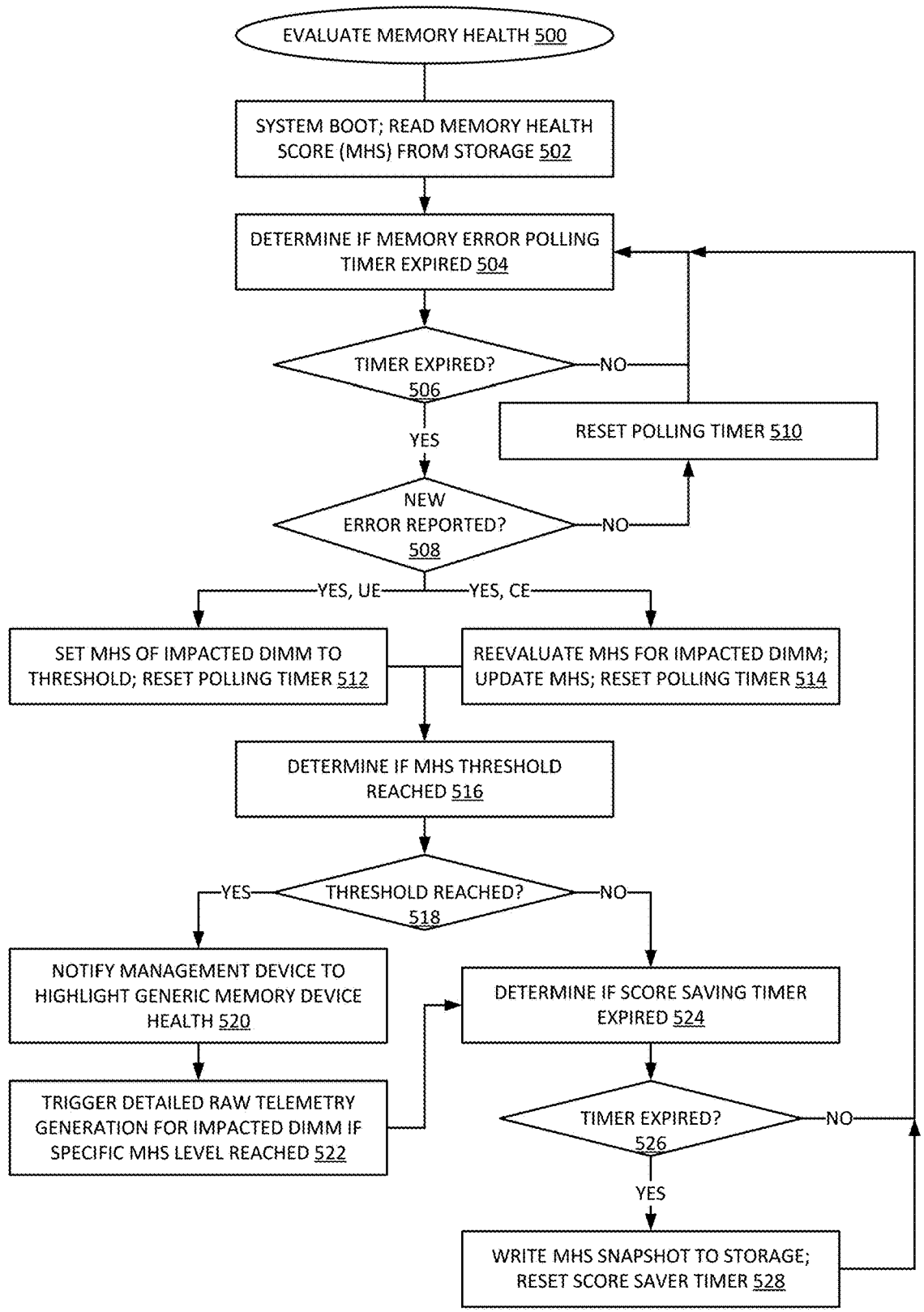
FIG. 5 is a flow diagram of an example of a process for predicting memory faults.

FIG. 5 is a flow diagram of an example of a process for predicting memory faults. Process 500 illustrates a flow that can be executed by a system with a UPE in accordance with an example of system 100. Process 500 represents a process to evaluate memory health.

In one example, on system boot, the UPE reads memory health score (MHS) information from storage, at 502. In one example, the UPE determines if a memory error polling timer has expired, at 504. The UPE can keep a timer to indicate a frequency of checking for error information to determine if there are errors that would indicate an impending failure due to a latent fault. If the timer has not expired, at 506 NO branch, the UPE can continue to monitor the timer until it expires, at 504.

If the timer has expired, at 506 YES branch, in one example, the UPE determines if there are new errors reported in the memory error reporting. The memory error reporting can be, for example, registers that store indications of errors corrected in a scrubbing operation. If there are no new errors reported, at 508 NO branch, in one example, the UPE resets the polling timer, at 510, and continues to monitor the timer until it is time to check for errors again, at 504.

In one example, if a new uncorrectable error is reported, at 508 YES, UE branch, the UPE can set the MHS of the impacted DIMM or other memory resource to an alert threshold, and reset the polling timer, at 512. In one example, if a new correctable error is reported, at 508 YES, CE branch, the UPE can reevaluate the MHS for the impacted DIMM or other memory resource, update the MHS, and reset the polling timer, at 514. The reevaluation includes correlation of the new error with hardware parameters to determine if the new errors indicate the likelihood of an uncorrectable error. The reevaluation of the MHS can include the computation of fault indicators as discussed above.

For any new error detected, the UPE can determine if the MHS threshold has been reached for a memory resource, at 516. In one example, the MHS threshold is zero, where the score starts at a non-zero value and is decremented based on error indicators. If the MHS threshold has been reached, at 518 YES branch, in one example, the UPE notifies a management device to highlight a generic memory device health, at 520. The management device can be a typical management device that has a routine to address memory fault, and the reporting of the MHS score threshold can simply follow the routine the management device would use for any generic health condition. Alternatively, the management device can have a dedicated routine for predictive memory health conditions detected by the UPE.

In one example, an optional operation is for the management device to trigger a detailed raw telemetry generation for the impacted DIMM or memory resource if a specific MHS level is reached, at 522. Such an operation assumes that a specific routine can be followed for predictive failure indications.

If the MHS reporting threshold is not reached, at 518 NO branch, or after the reporting to the management device in the case of reaching the threshold, in one example, the UPE can determine if a score saving timer has expired, at 524. If the timer has not expired, at 526 NO branch, the UPE can return to monitoring for error polling, at 504. If the score saving timer has expired, at 516 YES branch, in one example, the UPE writes an MHS snapshot to storage and resets the score saver timer, at 528. The UPE can then return to monitoring for error polling, at 504.

Figure 6:
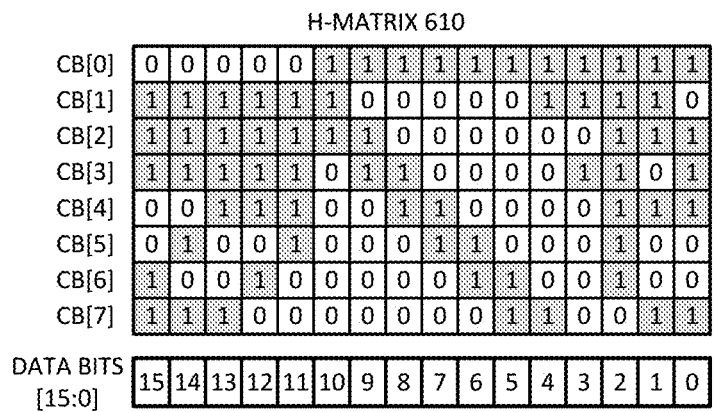
FIG. 6 is a block diagram of an example of check bit generation logic and syndrome bit generation logic to apply a matrix to perform checking and correction for error detection and prediction.
Figure 6:
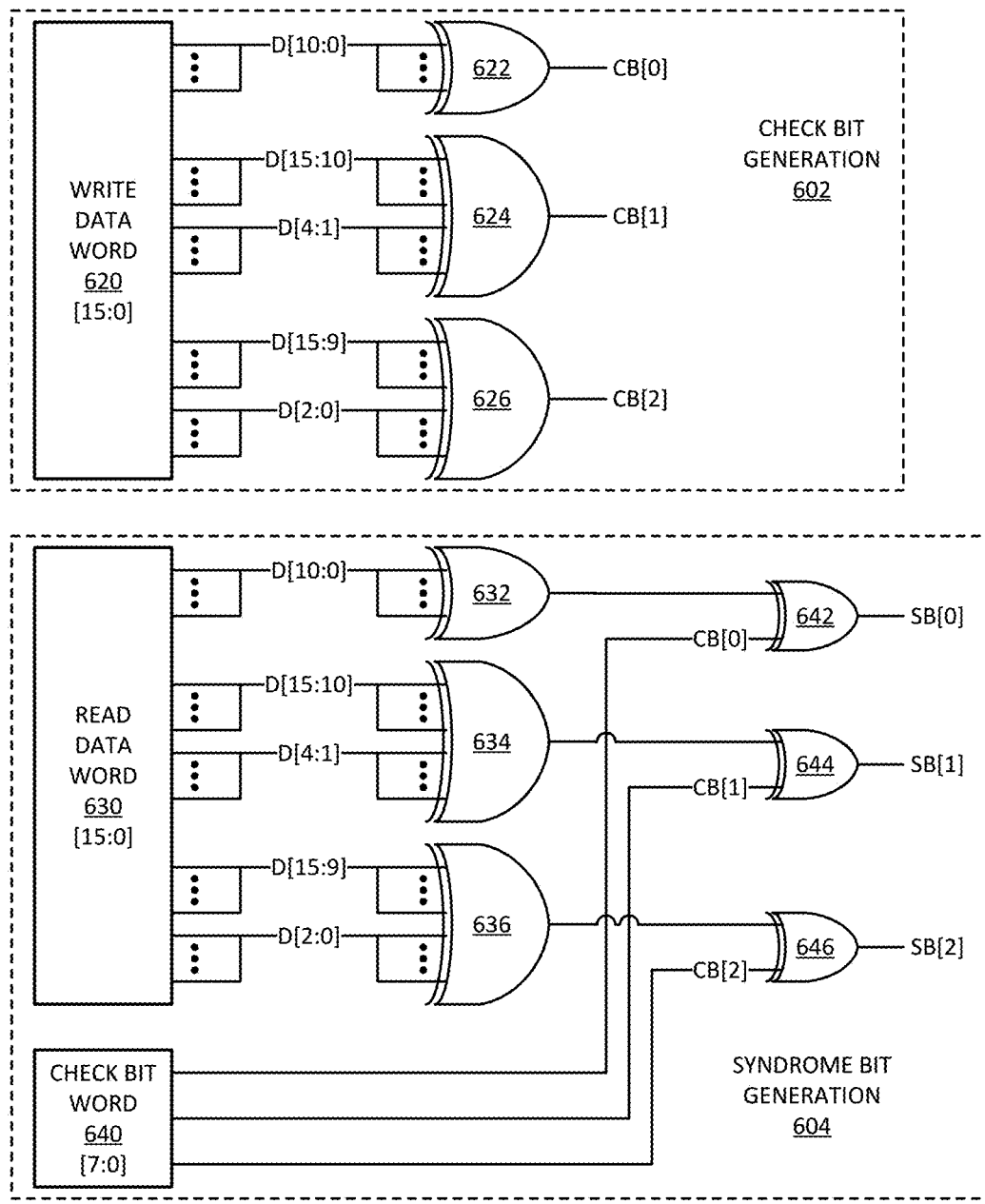

FIG. 6 is a block diagram of an example of check bit generation logic and syndrome bit generation logic to apply a matrix to perform checking and correction for error detection and prediction. H-matrix 610 represents a simplified example of the application of ECC by a memory device for on-die ECC, which can be used for detection and reporting of correctable errors. The reporting of the correctable errors can then be used by a UPE in accordance with any example described to determine the likelihood of an uncorrectable error occurring in the memory.

H matrix 610 represents an example of 16 bits of a code matrix for use with on-device ECC. It will be understood that a typical operational code word in modern computing systems includes more than 16 bits. However, the 16-bit H-matrix illustrates principles of ECC operation for either on-die ECC to be used in on-memory error checking and correction in accordance with any example herein or for system level ECC by the memory controller or error control in accordance with any example herein.

Matrix 610 can be part of an SEC (single-bit error correction) Hamming code, such as a hamming code for a 128-bit code word. Matrix 610 illustrates only 16 codes, one code bit for each data bit [15:0]. In one example, every code of matrix 610 corresponds to one data bit. In the example illustrated, each code includes 8 check bits CB[0:7]. When a syndrome is computed from the data word and check bits stored in the memory, the ECC engine can determine if the syndrome corresponds to one of the codes in matrix 610. If the ECC engine determines a syndrome matches with one of the codes, the ECC engine toggles the corresponding data bit to correct an error. Examples of check bit generation and syndrome bit generation are illustrated.

Check bit generation logic 602 represents logic to perform ECC operations to generate check bits. Syndrome bit generation logic 604 represents logic to perform ECC operations to generate syndrome bits to compare against the check bit. For purposes of illustration in the drawing, only logic related to check bits CB[0:2] are illustrated, and correspondingly, only syndrome bits SB[0:2] are illustrated.

As illustrated, the syndrome can be completely encoded in the ECC logic for the check bit generation and syndrome bit generation. In one example, check bit generation 602 includes XOR gates to receive write data word 620 and perform XOR operations for the one-bits of the code. For example, generation of CB[0] with respect to the 16 code word bits illustrated, bits D[10:0] are all ones, whereas bits D[15:11] are zeros. Thus, in one example, computation of CB[0] includes the XOR operation with XOR 622 of bits D[10:0] of the code word. Similarly, generation of the syndrome bit SB[0] includes logic to receive read data word 630 and perform XOR operation with XOR 632 of bits D[10:0] of the read data code word. The output of XOR 632 is then XORed with XOR 642 with CB[0] to generate SB[0].

It will be understood that as a technical matter, a true XOR operation can only exist for two inputs, where an output is one if and only if only one of the inputs is one. However, it is common convention to represent a cascade of XOR operations as a multi-input XOR (meaning a number of inputs greater than 2), such as XOR 622 for CB[0] and XOR 632 for SB[0]. The XOR operation has a commutative property, and the XORing of multiple pairs of inputs, and then the series XORing of the outputs of those operations can be interchanged in any order with the same result. Thus, the XOR operations have the practical effect of modulo 2 addition, which is also equivalent to odd parity detection. Odd parity detection provides a '1' as the output when there is an odd number of ones among the inputs, and an output zero when there is an even number of ones among the inputs.

In another example, generation of CB[1] with respect to the 16 code word bits illustrated, bits D[15:10] and D[4:1] are ones, and bits D[9:5] and D[0] are zeros. XOR 624 computes CB[1] from the one bits. Similarly, for the generation of CB[2], bits D[15:9] and D[2:0] are ones, and bits D[8:3] are zeros. XOR 626 computes CB[2] from the one bits.

Syndrome bit generation 604 represents logic to receive read data word 630 and check bit word 640, and generate the syndrome bits by comparison of the CB computation with the stored check bits. Similarly, syndrome bit generation of SB[1] with respect to the 16 code word bits illustrated, XOR 634 computes an XOR of D[15:10] and D[4:1], and then XOR 644 computes SB[1] by XOR of CB[1] with the output of XOR 634. Similarly, syndrome bit generation of SB[2] with respect to the 16 code word bits illustrated, XOR 636 computes an XOR of D[15:9] and D[2:0], and then XOR 646 computes SB[2] by XOR of CB[2] with the output of XOR 636.

Based on the determination of the check bits and syndrome bits, the system can identify errors and potentially flip bits, e.g., for a bit or column of CB[7:0] found to match with the syndrome bits. An ECS system applies such techniques to perform scrubbing on memory addresses. In one example, a system applies the error detection of the ECC to detect memory errors and provide error information to a UPE to allow the detection of error patterns for the prediction of uncorrectable errors, in accordance with any example herein.

Figure 7:
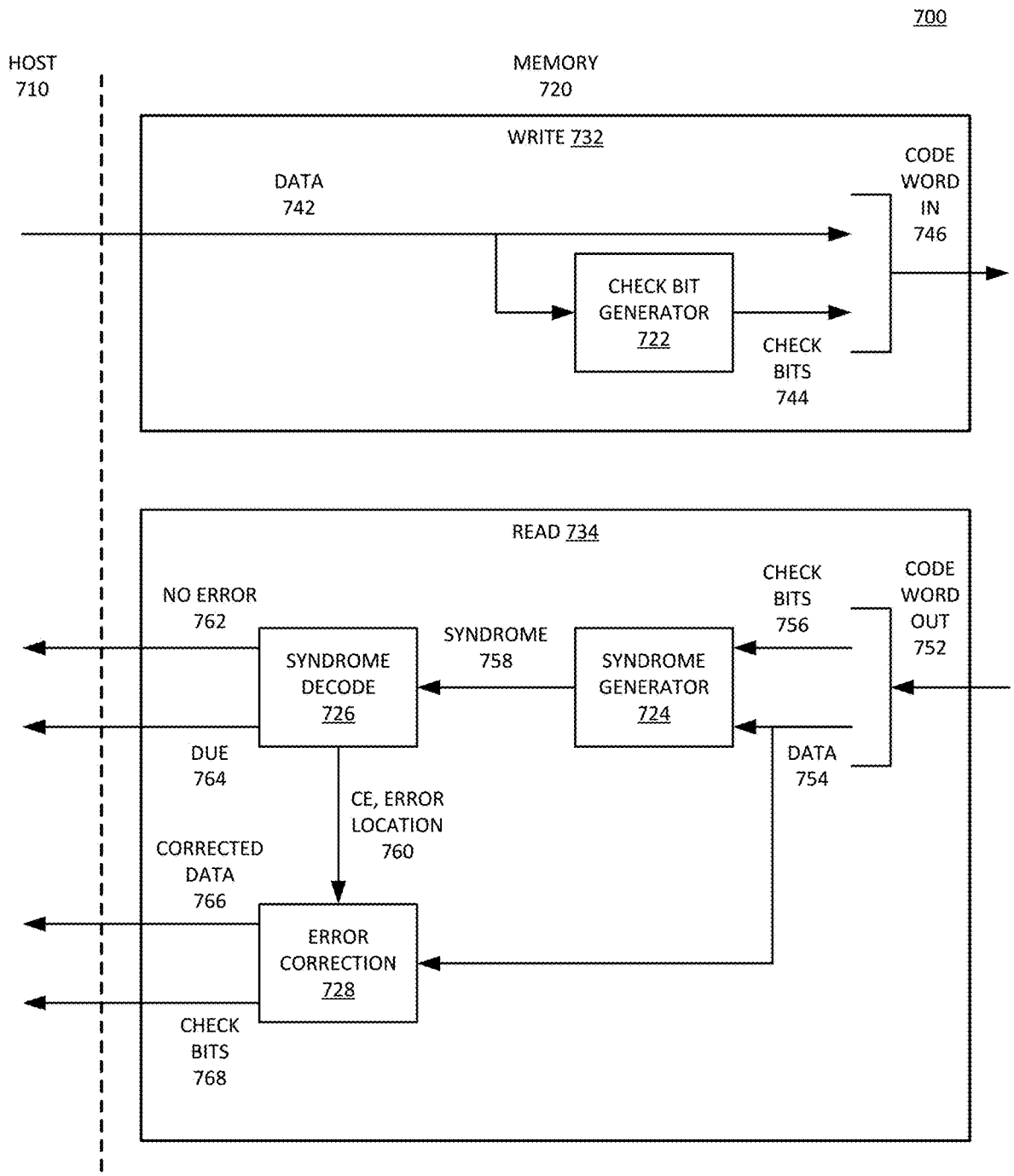
FIG. 7 is a block diagram of an example of an on-die error checking and correction (ECC) subsystem.

FIG. 7 is a block diagram of an example of an on-die error checking and correction (ECC) subsystem. System 700 provides an example of on-die ECC circuitry for a system in accordance with system 100. Host 710 includes a memory controller or equivalent or alternative circuit or component that manages access to memory 720. Host 710 performs external ECC on data read from memory 720. Memory 720 implements on-die ECC to check and correct data prior to sending the data to host 710. Host 710 can include a UPE that receives an indication of errors detected by system 700 for a scrubbing operation.

System 700 illustrates write path 732 in memory 720, which represents a path for data written from host 710 to memory 720. Host 710 provides data 742 to memory 720 for writing to the memory array(s). In one example, memory 720 generates check bits 744 with check bit generator 722 to store with the data in memory. Check bits 744 can be referred to as ECC bits, and enable memory 720 to correct an error that might occur in the writing to and reading from the memory array(s). Data 742 and check bits 744 can be included as code word in 746, which is written to the memory resources.

Read path 734 represents a path for data read from memory 720 to host 710. In one example, at least certain hardware components of write path 732 and read path 734 are the same hardware. In one example, memory 720 fetches code word out 752 in response to a Read command from host 710. The code word can include data 754 and check bits 756. Data 754 and check bits 756 can correspond, respectively, to data 742 and check bits 744 written in write path 732. Thus, a read can access data and ECC bits.

It will be understood that error correction in read path 734 can include the application of an XOR (exclusive OR) tree to a corresponding H matrix to detect errors and selectively correct errors (in the case of a single bit error). The structure of the XOR tree can be designed to implement the H matrix. As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one example, memory 720 includes syndrome decode 724, which enables the memory to apply check bits 756 to data 754 to detect errors in the read data. Syndrome decode 724 can generate syndrome 758 for use in generating appropriate error information for the read data. Data 754 can also be forwarded to error correction 728 for correction of a detected error.

In one example, syndrome decode 724 passes syndrome 758 to syndrome generator 726 to generate an error vector. In one example, check bit generator 722 and syndrome generator 726 are fully specified by a corresponding H matrix for the memory device. In one example, if there are no errors in the read data (e.g., zero syndrome 758), syndrome generator 726 generates a no error signal 762. In one example, if there are multiple errors in the read data (e.g., non-zero syndrome 758 that does not match any of the columns in a corresponding H matrix), syndrome generator 726 generates a DUE (detected uncorrected error) signal 764, which indicates a detected, uncorrected error. DUE signal 764 can indicate a multibit error that memory 720 was not able to correct by internal ECC.

In one example, if there is a single bit error (e.g., non-zero syndrome 758 that matches one of the columns of a corresponding H matrix), syndrome generator 726 can generate a CE (corrected error) signal with error location 760, which is a corrected error indication to error correction logic 728. Error correction 728 can apply the corrected error to the specified location in data 754 to generate corrected data 766 for output to host 710. In one example, error correction 728 also generates check bits 768, which includes the check bits for the read data.

Check bits 768 can be considered an error vector that indicates a state of errors in the read data transmitted to host 710. It will be understood that zero syndrome (no error 762) condition and a corrected SBE (single bit error) resulting in corrected data 766 will have the same check bits 768, indicating no error to host 710. Thus, check bits 768 will not provide information about SBE in memory 720, but only multibit errors. In one example, system 700 writes corrected data back to the memory array.

Figure 8:
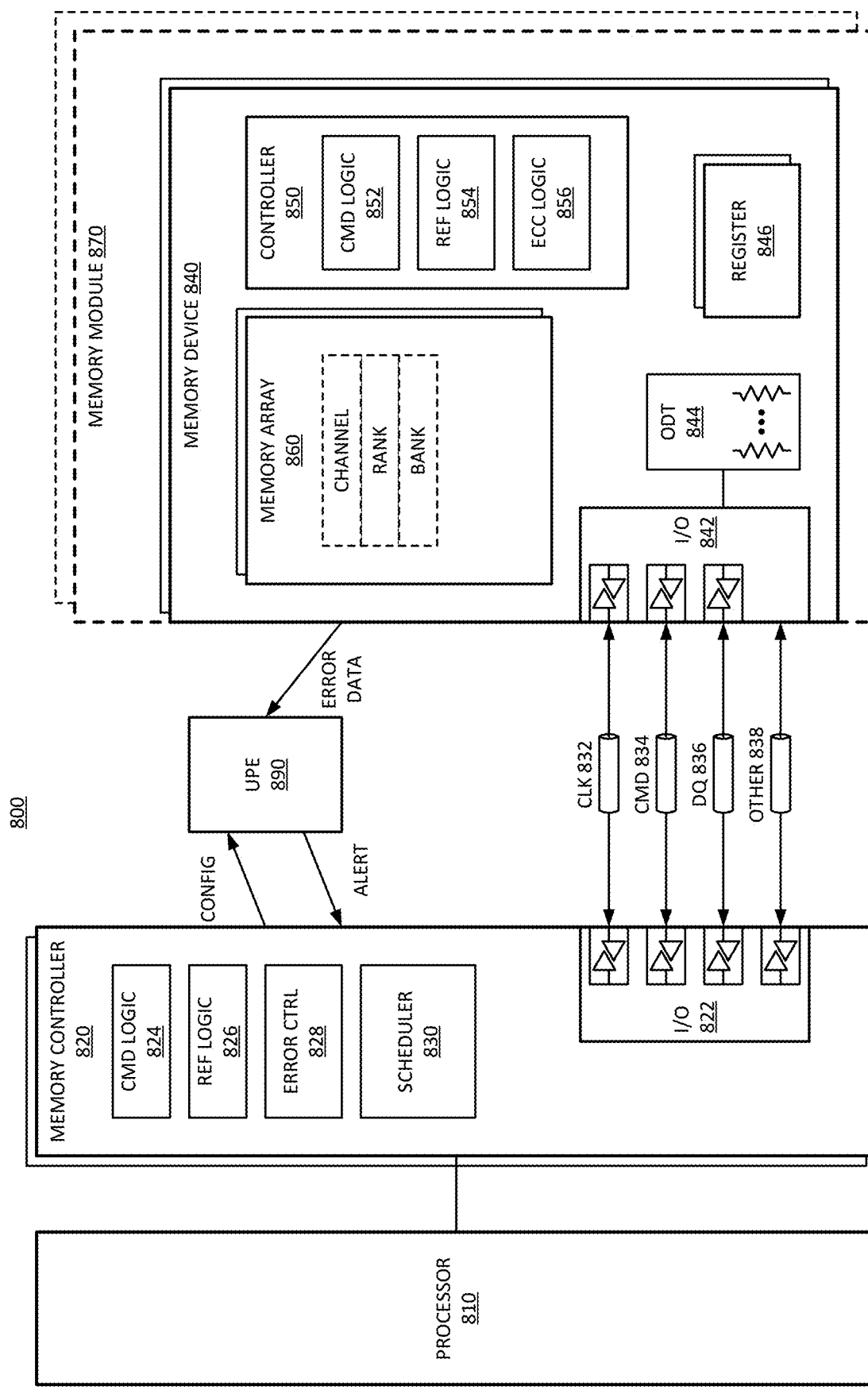
FIG. 8 is a block diagram of an example of a memory subsystem in which uncorrectable error prediction can be implemented.

FIG. 8 is a block diagram of an example of a memory subsystem in which uncorrectable error prediction can be implemented. System 800 includes a processor and elements of a memory subsystem in a computing device. System 800 is an example of a system in accordance with an example of system 100.

In one example, system 800 includes UPE 890 or other error prediction engine to compute a correlation of correctable errors detected with hardware configuration to determine a likelihood an uncorrectable error will occur. UPE 890 can be on a system board of system 800. UPE 890 can perform prediction in accordance with any example herein. In one example, controller 850 of memory device 840 includes ECC logic 856 to detect and correct errors, such as correctable errors, locally to the memory device. ECC logic 856 can be referred to as on-die ECC. In one example, memory controller includes error control (CTRL) 828 to receive alerts generated by UPE 890 based on error prediction. In one example, the host (either memory controller or other component of the host) provides hardware configuration information to UPE 890 to enable UPE 890 to perform error prediction. The memory devices can provide error data that UPE 890 uses to correlate to the hardware configuration to generate an error prediction in accordance with any example provided herein.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 (HBM version 2, JESD235C, originally published by JEDEC in January 2020), HBM3 (HBM version 3 currently in discussion by JEDEC), or others or combinations of memory technologies, and technologies based on derivatives or extensions of such specifications.

In addition to, or alternatively to, volatile memory, in one example, the memory module can be a persistent memory DIMM or nonvolatile system memory, referring to nonvolatile memory connected to the system memory bus. Such a memory device can include a three dimensional crosspoint (3DXP) memory device. 3DXP can operate as a byte addressable nonvolatile memory device or as a block addressable nonvolatile memory device. A memory device can include a nonvolatile, byte addressable media or block addressable media that stores data based on a resistive state of the memory cell, or a phase of the memory cell. In one example, the memory device can use chalcogenide phase change material (e.g., chalcogenide glass). In one example, the system memory device can be or include NAND flash memory, NOR flash memory, single or multi-level phase change memory (PCM) or phase change memory with a switch (PCMS), a resistive memory, nanowire memory, ferroelectric transistor random-access memory (FeTRAM), magnetoresistive random-access memory (MRAM) memory that incorporates memristor technology, or spin transfer torque (STT)-MRAM, or a combination of any of the above, or other memory.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 8B10B encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a x4 interface, a x8 interface, a x16 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 840 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., x16 or x8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. The remaining bits of the word will be provided or received by other memory devices in parallel.

In one example, memory devices 840 are disposed directly on a motherboard or host system platform (e.g., a PCB (printed circuit board) or substrate on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include one or more memory arrays 860. Memory array 860 represents addressable memory locations or storage locations for data. Typically, memory array 860 is managed as rows of data, accessed via wordline (rows) and bitline (individual bits within a row) control. Memory array 860 can be organized as separate channels, ranks, and banks of memory. Channels may refer to independent control paths to storage locations within memory devices 840. Ranks may refer to common locations across multiple memory devices (e.g., same row addresses within different devices) in parallel. Banks may refer to sub-arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822 (for example, ODT for DQ lines or ODT for CA lines), and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
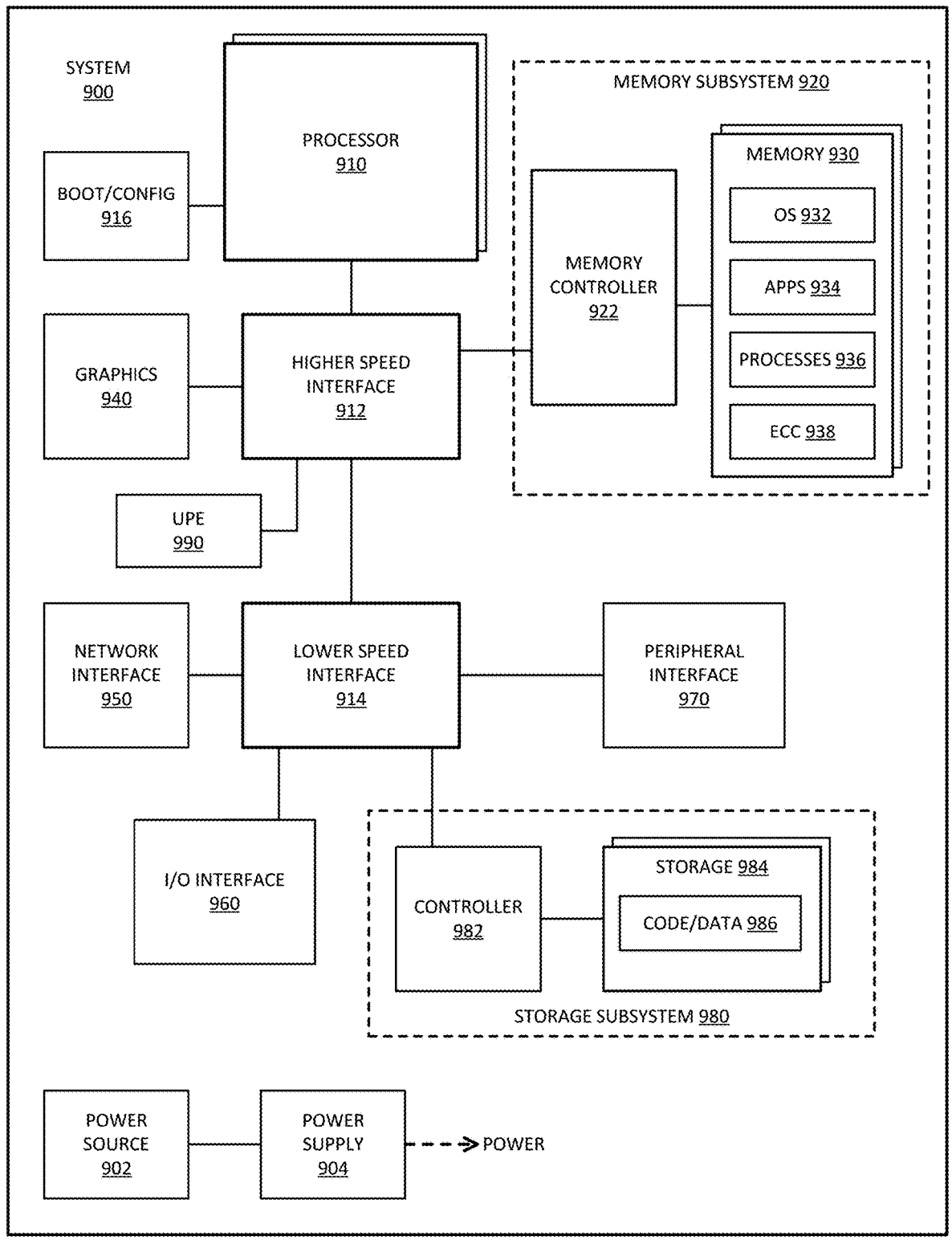
FIG. 9 is a block diagram of an example of a computing system in which uncorrectable error prediction can be implemented.

FIG. 9 is a block diagram of an example of a computing system in which uncorrectable error prediction can be implemented. System 900 represents a computing device in accordance with any example herein, and can be a laptop computer, a desktop computer, a tablet computer, a server, a gaming or entertainment control system, embedded computing device, or other electronic device. System 900 represents a system in accordance with an example of system 100.

In one example, system 900 includes UPE 990 or other error prediction engine to compute a correlation of correctable errors detected with hardware configuration to determine a likelihood an uncorrectable error will occur. In one example, UPE 990 is a controller or part of a controller on higher speed interface 912. In one example, UPE 990 is a controller or part of a controller on lower speed interface 914. UPE 990 can perform prediction in accordance with any example herein. In one example, UPE 990 receives error information from memory 930 and hardware configuration information from a system component (e.g., BIOS or a device on interface 912 or interface 914). In one example, memory 930 includes ECC 938 to detect and correct errors, such as correctable errors, locally to the memory device. ECC 938 can be referred to as on-die ECC. UPE 990 performs error prediction based on hardware configuration information and error information from memory, to generate an error prediction in accordance with any example provided herein.

System 900 includes processor 910 can include any type of microprocessor, central processing unit (CPU), graphics processing unit (GPU), processing core, or other processing hardware, or a combination, to provide processing or execution of instructions for system 900. Processor 910 can be a host processor device. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

System 900 includes boot/config 916, which represents storage to store boot code (e.g., basic input/output system (BIOS)), configuration settings, security hardware (e.g., trusted platform module (TPM)), or other system level hardware that operates outside of a host OS. Boot/config 916 can include a nonvolatile storage device, such as read-only memory (ROM), flash memory, or other memory devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more varieties of random-access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include stand-alone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, NAND, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
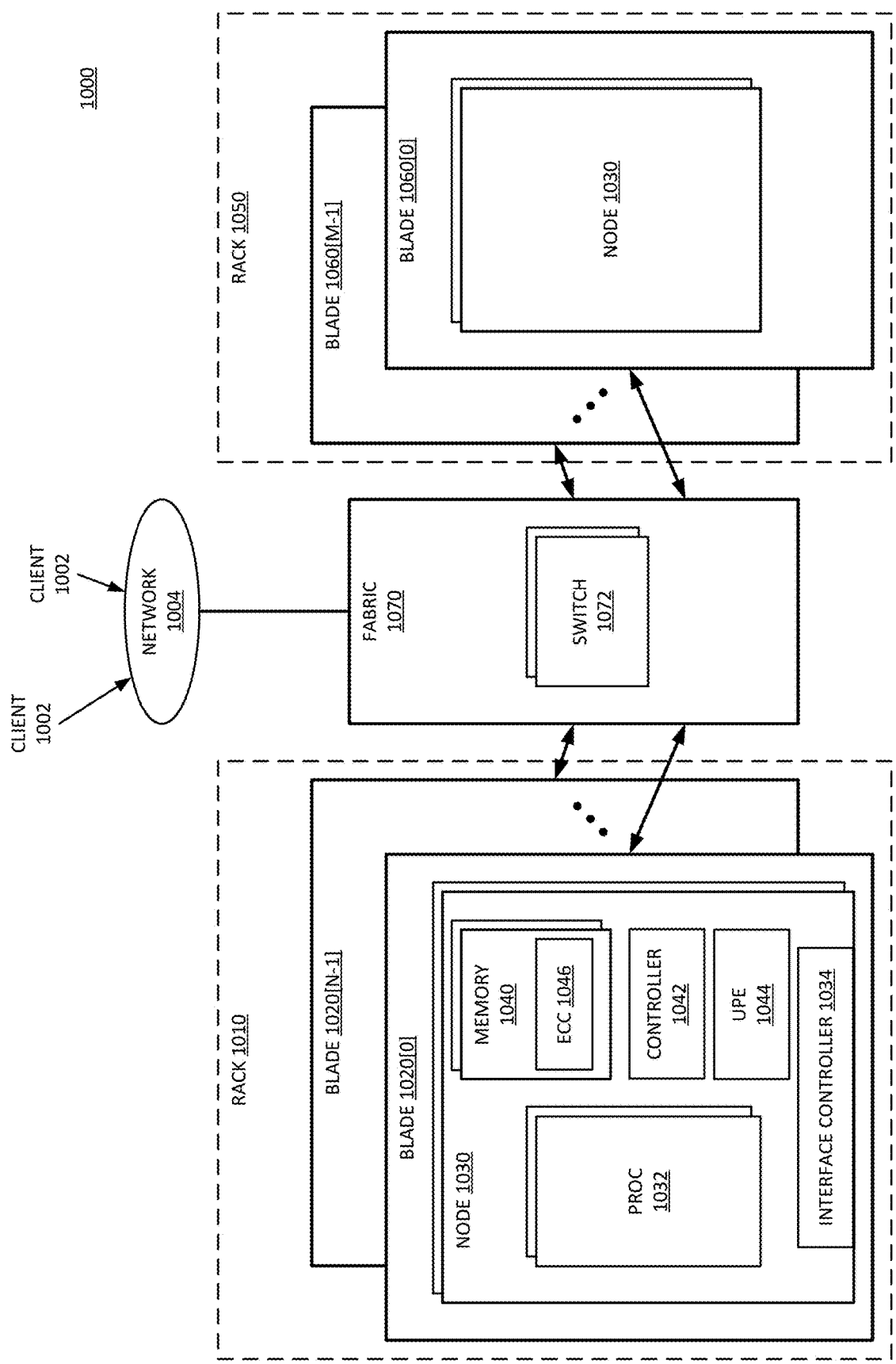
FIG. 10 is a block diagram of an example of a multi-node network in which uncorrectable error prediction can be implemented.

FIG. 10 is a block diagram of an example of a multi-node network in which uncorrectable error prediction can be implemented. System 1000 represents a network of nodes that include a UPE in accordance with an example of system 100. In one example, system 1000 represents a server farm. In one example, system 1000 represents a data cloud or a processing cloud. Nodes 1030 of system 1000 represent a system in accordance with an example of system 100. Node 1030 includes memory 1040. Node 1030 includes controller 1042, which represents a memory controller to manage access to memory 1040.

In one example, node 1030 includes UPE 1044 or other error prediction engine to compute a correlation of correctable errors detected with hardware configuration to determine a likelihood an uncorrectable error will occur. In one example, UPE 1044 is a controller or part of a controller on a system board of node 1030. UPE 1044 can perform prediction in accordance with any example herein. In one example, memory 1040 includes ECC 1046 to generate error reports, which UPE 1044 can use with hardware configuration information from a system component to generate an error prediction. UPE 1044 performs error prediction based on hardware configuration information and error information from memory, to generate an error prediction in accordance with any example provided herein.

One or more clients 1002 make requests over network 1004 to system 1000. Network 1004 represents one or more local networks, or wide area networks, or a combination.

Clients 1002 can be human or machine clients, which generate requests for the execution of operations by system 1000. System 1000 executes applications or data computation tasks requested by clients 1002.

In one example, system 1000 includes one or more racks, which represent structural and interconnect resources to house and interconnect multiple computation nodes. In one example, rack 1010 includes multiple nodes 1030. In one example, rack 1010 hosts multiple blade components 1020. Hosting refers to providing power, structural or mechanical support, and interconnection. Blades 1020 can refer to computing resources on printed circuit boards (PCBs), where a PCB houses the hardware components for one or more nodes 1030. In one example, blades 1020 do not include a chassis or housing or other "box" other than that provided by rack 1010. In one example, blades 1020 include housing with exposed connector to connect into rack 1010. In one example, system 1000 does not include rack 1010, and each blade 1020 includes a chassis or housing that can stack or otherwise reside in close proximity to other blades and allow interconnection of nodes 1030.

System 1000 includes fabric 1070, which represents one or more interconnectors for nodes 1030. In one example, fabric 1070 includes multiple switches 1072 or routers or other hardware to route signals among nodes 1030. Additionally, fabric 1070 can couple system 1000 to network 1004 for access by clients 1002. In addition to routing equipment, fabric 1070 can be considered to include the cables or ports or other hardware equipment to couple nodes 1030 together. In one example, fabric 1070 has one or more associated protocols to manage the routing of signals through system 1000. In one example, the protocol or protocols is at least partly dependent on the hardware equipment used in system 1000.

As illustrated, rack 1010 includes N blades 1020. In one example, in addition to rack 1010, system 1000 includes rack 1050. As illustrated, rack 1050 includes M blades 1060. M is not necessarily the same as N; thus, it will be understood that various different hardware equipment components could be used, and coupled together into system 1000 over fabric 1070. Blades 1060 can be the same or similar to blades 1020. Nodes 1030 can be any type of node and are not necessarily all the same type of node. System 1000 is not limited to being homogenous, nor is it limited to not being homogenous.

For simplicity, only the node in blade 1020 [0] is illustrated in detail. However, other nodes in system 1000 can be the same or similar. At least some nodes 1030 are computation nodes, with processor (proc) 1032 and memory 1040. A computation node refers to a node with processing resources (e.g., one or more processors) that executes an operating system and can receive and process one or more tasks. In one example, at least some nodes 1030 are server nodes with a server as processing resources represented by processor 1032 and memory 1040. A storage server refers to a node with more storage resources than a computation node, and rather than having processors for the execution of tasks, a storage server includes processing resources to manage access to the storage nodes within the storage server.

In one example, node 1030 includes interface controller 1034, which represents logic to control access by node 1030 to fabric 1070. The logic can include hardware resources to interconnect to the physical interconnection hardware. The logic can include software or firmware logic to manage the interconnection. In one example, interface controller 1034 is or includes a host fabric interface, which can be a fabric interface in accordance with any example described herein.

Processor 1032 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 1040 can be or include memory devices and a memory controller.

In general with respect to the descriptions herein, in one example an apparatus to predict memory device failure includes: a substrate; and a controller disposed on the substrate, the controller to execute a memory failure prediction engine, the memory failure prediction engine to correlate a hardware configuration of the memory device with correctable errors (CEs) detected in data of the memory device, and predict an uncorrectable error (UE) based on correlation of the hardware configuration with the detected CEs.

In one example of the apparatus, the apparatus includes the memory device disposed on the substrate. In accordance with any preceding example of the apparatus, in one example, multiple memory devices are disposed on the substrate. In accordance with any preceding example of the apparatus, in one example, the memory devices comprise dynamic random access memory (DRAM) devices. In accordance with any preceding example of the apparatus, in one example, the controller comprises a memory controller. In any preceding example of the apparatus, the memory device comprises a dual inline memory module (DIMM), and wherein the controller comprises a controller of the DIMM. In any preceding example of the apparatus, the memory failure prediction engine is to correlate a fault corresponding to a hardware structure of the memory device with the detected CEs, including correlation of structure-specific fault indicators for the memory device. In any preceding example of the apparatus, the memory failure prediction engine is to generate a row fault predictor based on a pattern of CEs detected in a row of memory. In any preceding example of the apparatus, the memory failure prediction engine is to generate a column fault predictor based on a pattern of CEs detected in a column of memory. In any preceding example of the apparatus, the memory failure prediction engine is to generate a bank fault predictor based on a pattern of CEs detected in a bank of memory. In any preceding example of the apparatus, the memory failure prediction engine is to generate a fault predictor based on a rate of errors for a specific hardware structure. In any preceding example of the apparatus, the memory failure prediction engine is to identify a failure threshold based on a failure prediction model built for the memory device. In any preceding example of the apparatus, the memory failure prediction model comprises a model stored in firmware. In any preceding example of the apparatus, the memory failure prediction model comprises a model implemented in hardware, or implemented in a combination of hardware and firmware. In any preceding example of the apparatus, the controller is to receive an indication of detected CEs from an error scrubbing engine of the memory device.

In general with respect to the descriptions herein, in one example an apparatus to predict memory device failure includes: a memory device; and a controller coupled to the memory device to execute a memory failure prediction engine, the memory failure prediction engine to correlate a hardware configuration of the memory device with correctable errors (CEs) detected in data of the memory device, and predict an uncorrectable error (UE) based on correlation of the hardware configuration with the detected CEs.

In an example of the apparatus, the controller comprises a memory controller. In any preceding example of the apparatus, the memory device comprises a dual inline memory module (DIMM), and wherein the controller comprises a controller of the DIMM. In any preceding example of the apparatus, the memory failure prediction engine is to correlate a fault corresponding to a hardware structure of the memory device with the detected CEs, including correlation of structure-specific fault indicators for the memory device. In any preceding example of the apparatus, the memory failure prediction engine is to generate a row fault predictor based on a pattern of CEs detected in a row of memory. In any preceding example of the apparatus, the memory failure prediction engine is to generate a column fault predictor based on a pattern of CEs detected in a column of memory. In any preceding example of the apparatus, the memory failure prediction engine is to generate a bank fault predictor based on a pattern of CEs detected in a bank of memory. In any preceding example of the apparatus, the memory failure prediction engine is to generate a fault predictor based on a rate of errors for a specific hardware structure. In any preceding example of the apparatus, the memory failure prediction engine is to identify a failure threshold based on a failure prediction model built for the memory device. In any preceding example of the apparatus, the memory failure prediction model comprises a model stored in firmware. In any preceding example of the apparatus, the memory failure prediction model comprises a model implemented in hardware, or implemented in a combination of hardware and firmware. In any preceding example of the apparatus, the controller is to receive an indication of detected CEs from an error scrubbing engine of the memory device.

In general with respect to the descriptions herein, in one example a system includes: a host hardware platform including a central processing unit (CPU) and a dual inline memory module (DIMM) having multiple memory devices; and a controller coupled to the memory devices of the DIMM, the controller to execute a memory failure prediction engine, the memory failure prediction engine to correlate a hardware configuration of the host hardware platform with correctable errors (CEs) detected in data of the memory devices, and predict an uncorrectable error (UE) based on correlation of the hardware configuration with the detected CEs.

In an example of the system, the controller comprises a memory controller. In any preceding example of the system, the memory device comprises a dual inline memory module (DIMM), and wherein the controller comprises a controller of the DIMM. In any preceding example of the system, the memory failure prediction engine is to correlate a fault corresponding to a hardware structure of the memory device with the detected CEs, including correlation of structure-specific fault indicators for the memory device. In any preceding example of the system, the memory failure prediction engine is to generate a row fault predictor based on a pattern of CEs detected in a row of memory. In any preceding example of the system, the memory failure prediction engine is to generate a column fault predictor based on a pattern of CEs detected in a column of memory. In any preceding example of the system, the memory failure prediction engine is to generate a bank fault predictor based on a pattern of CEs detected in a bank of memory. In any preceding example of the system, the memory failure prediction engine is to generate a fault predictor based on a rate of errors for a specific hardware structure. In any preceding example of the system, the memory failure prediction engine is to identify a failure threshold based on a failure prediction model built for the memory device. In any preceding example of the system, the memory failure prediction model comprises a model stored in firmware. In any preceding example of the system, the memory failure prediction model comprises a model implemented in hardware, or implemented in a combination of hardware and firmware. In any preceding example of the system, the controller is to receive an indication of detected CEs from an error scrubbing engine of the memory device. In any preceding example of the system, the system further includes one or more of: a display communicatively coupled to the CPU; a network interface communicatively coupled to a host processor; or a battery to power the system.

In general with respect to the descriptions herein, in one example a method includes: receiving an indication of correctable errors (CEs) detected in data of a memory device; correlating a hardware configuration of the memory device with the detected CEs; and predicting an uncorrectable error (UE) based on correlation of the hardware configuration with the detected CEs.

In an example of the method, the memory device comprises a dual inline memory module (DIMM). In any preceding example of the method, correlating a fault corresponding to the hardware configuration of the memory device with the detected CEs comprises correlating a hardware structure of the memory device with the detected CEs, including correlating structure-specific fault indicators for the memory device. In any preceding example of the method, predicting the UE comprises generating a row fault predictor based on a pattern of CEs detected in a row of memory. In any preceding example of the method, predicting the UE comprises generating a column fault predictor based on a pattern of CEs detected in a column of memory. In any preceding example of the method, predicting the UE comprises generating a bank fault predictor based on a pattern of CEs detected in a bank of memory. In any preceding example of the method, predicting the UE comprises identifying a failure threshold based on a failure prediction model built for the memory device.

In general with respect to the descriptions herein, in one example a computer-readable storage medium includes instructions stored thereon, which when executed by a processor cause the processor to execute a method in accordance with any example of the preceding two paragraphs.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface.

A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus to predict memory device failure, comprising:
    a substrate; and
    a controller disposed on the substrate, the controller to execute a memory failure prediction engine, the memory failure prediction engine to correlate a hardware configuration of a memory device with correctable errors (CEs) detected by an on-die error checking and correction (ECC) circuit of the memory device and provided to the controller by the memory device, and predict an uncorrectable error (UE) based on correlation of the hardware configuration with the detected CEs.

2. The apparatus of claim 1, further comprising:
    the memory device disposed on the substrate.

3. The apparatus of claim 2, wherein the memory device is one of multiple memory devices disposed on the substrate, wherein the multiple memory devices comprise dynamic random access memory (DRAM) devices.

4. The apparatus of claim 1, wherein the controller comprises a memory controller.

5. The apparatus of claim 1, wherein the memory device comprises a dual inline memory module (DIMM), and wherein the controller comprises a controller of the DIMM.

6. The apparatus of claim 1, wherein the memory failure prediction engine is to correlate a fault corresponding to a hardware structure of the memory device with the detected CEs, including correlation of structure-specific fault indicators for the memory device.

7. The apparatus of claim 6, wherein the memory failure prediction engine is to generate a row fault predictor based on a pattern of CEs detected in a row of the memory device.

8. The apparatus of claim 6, wherein the memory failure prediction engine is to generate a column fault predictor based on a pattern of CEs detected in a column of the memory device.

9. The apparatus of claim 6, wherein the memory failure prediction engine is to generate a bank fault predictor based on a pattern of CEs detected in a bank of the memory device.

10. The apparatus of claim 6, wherein the memory failure prediction engine is to generate a fault predictor based on a rate of errors for a specific hardware structure.

11. The apparatus of claim 1, wherein the memory failure prediction engine is to identify a failure threshold based on a memory failure prediction model built for the memory device.

12. The apparatus of claim 11, wherein the memory failure prediction model comprises a model stored in firmware.

13. The apparatus of claim 11, wherein the memory failure prediction model comprises a model implemented in hardware, or implemented in a combination of hardware and firmware.

14. The apparatus of claim 1, wherein the controller is to receive an indication of detected CEs from an error scrubbing engine of the memory device.

15. A method for predicting memory device failure, comprising:
    receiving an indication of correctable errors (CEs) detected by an on-die error checking and correction (ECC) circuit of a memory device and provided to a controller by the memory device;
    correlating a hardware configuration of the memory device with the detected CEs; and
    predicting an uncorrectable error (UE) based on correlation of the hardware configuration with the detected CEs.

16. The method of claim 15, wherein the memory device comprises a dual inline memory module (DIMM).

17. The method of claim 15, wherein correlating a fault corresponding to the hardware configuration of the memory device with the detected CEs comprises correlating a hardware structure of the memory device with the detected CEs, including correlating structure-specific fault indicators for the memory device.

18. The method of claim 17, wherein predicting the UE comprises generating a row fault predictor based on a pattern of CEs detected in a row of the memory device.

19. The method of claim 17, wherein predicting the UE comprises generating a column fault predictor based on a pattern of CEs detected in a column of the memory device.

20. The method of claim 17, wherein predicting the UE comprises generating a bank fault predictor based on a pattern of CEs detected in a bank of the memory device.

21. The method of claim 15, wherein predicting the UE comprises identifying a failure threshold based on a failure prediction model built for the memory device.

22. A system comprising:
    a host hardware platform including a central processing unit (CPU) and a dual inline memory module (DIMM) having multiple memory devices; and
    a controller coupled to the memory devices of the DIMM, the controller to execute a memory failure prediction engine, the memory failure prediction engine to correlate a hardware configuration of the host hardware platform with correctable errors (CEs) detected by an on-die error checking and correction (ECC) circuit of the memory devices and provided to the controller by the memory devices, and predict an uncorrectable error (UE) based on correlation of the hardware configuration with the detected CEs.

23. The system of claim 22, wherein the memory failure prediction engine is to correlate a fault corresponding to a hardware structure of a memory device with the detected CEs, including one or more of:
- generation of a row fault predictor based on a pattern of CEs detected in a row of the memory device;
- generation of a column fault predictor based on a pattern of CEs detected in a column of the memory device; and,
- generation of a bank fault predictor based on a pattern of CEs detected in a bank of the memory device.

24. The system of claim 22, wherein the memory failure prediction engine is to identify a failure threshold based on a failure prediction model built for the memory devices.

25. The system of claim 22, further comprising one or more of:
- a display communicatively coupled to the CPU;
- a network interface communicatively coupled to a host processor; and
- a battery to power the system.

* * * * *